US008766264B2

(12) United States Patent
Yuan

(10) Patent No.: US 8,766,264 B2
(45) Date of Patent: Jul. 1, 2014

(54) THIN FILM TRANSISTOR WITH CONCAVE REGION IN THE GATE INSULATING LAYER THEREOF

(75) Inventor: Jianfeng Yuan, Beijing (CN)

(73) Assignees: BOE Technology Group Co., Ltd., Beijing (CN); Beijing BOE Display Technology Co., Ltd., Beijing (CN)

(*) Notice: Subject to any disclaimer, the term of this patent is extended or adjusted under 35 U.S.C. 154(b) by 53 days.

(21) Appl. No.: 13/324,281

(22) Filed: Dec. 13, 2011

(65) Prior Publication Data

US 2012/0153288 A1     Jun. 21, 2012

(30) Foreign Application Priority Data

Dec. 20, 2010    (CN) .......................... 2010 1 0597262

(51) Int. Cl.
| | |
|---|---|
| *H01L 29/04* | (2006.01) |
| *H01L 31/036* | (2006.01) |
| *H01L 31/0376* | (2006.01) |
| *H01L 31/20* | (2006.01) |
| *H01L 27/12* | (2006.01) |
| *H01L 29/423* | (2006.01) |

(52) U.S. Cl.
CPC ...... *H01L 27/1237* (2013.01); *H01L 29/42384* (2013.01)
USPC .. 257/59; 257/72; 257/E29.117; 257/E29.273

(58) Field of Classification Search
USPC ............... 257/59, 72, 347, E29.117, E29.273
See application file for complete search history.

(56) References Cited

U.S. PATENT DOCUMENTS

| | | | |
|---|---|---|---|
| 6,010,922 A * | 1/2000 | Hata et al. ..................... | 438/158 |
| 2003/0080337 A1* | 5/2003 | Yudasaka et al. ............... | 257/59 |
| 2003/0122196 A1 | 7/2003 | Hwang | |
| 2009/0194766 A1 | 8/2009 | Park et al. | |

* cited by examiner

*Primary Examiner* — Hoai V Pham
(74) *Attorney, Agent, or Firm* — Ladas & Parry LLP

(57) ABSTRACT

An embodiment of the disclosed technology provides a thin film transistor device comprising a source electrode, a drain electrode, a gate electrode, an active layer corresponding to the gate electrode, and a gate insulation layer formed between the gate electrode and the active layer; a concave region corresponding to the gate electrode is provided in the gate insulation layer.

12 Claims, 7 Drawing Sheets

THIN FILM TRANSISTOR WITH CONCAVE REGION IN THE GATE INSULATING LAYER THEREOF

BACKGROUND

Embodiments of the disclosed technology relate to a thin film transistor and a manufacturing method thereof.

Recently, the panel display technology is undergoing a rapidly development. Performance of thin film transistor (TFT) which is used as an elementary element of a driving circuit of an active matrix display device is continuously improved. Compared with traditional amorphous silicon TFT, low temperature polycrystalline silicon (LTPS) TFT is advantageous due to its high electron mobility, low threshold voltage and so on. Therefore, compared with the driving circuit constituted with the traditional amorphous silicon TFTs, the driving circuit constituted by LTPS TFTs exhibits higher speed and lower power consumption.

The active region of a LTPS TFT is formed by a LTPS thin film. Generally, the LTPS thin film is formed by annealing an amorphous silicon thin film. An N-type LTPS TFT and a P-type LTPS TFT, which are formed by such the poly-crystallization technology, have different threshold voltages. The absolute value of the threshold voltage of a P-type LTPS TFT is generally larger than that of an N-type LTPS TFT. When complementary metal oxide semiconductor (CMOS) devices constituted with such LTPS TFTs are used in the peripheral driving circuit of an active matrix display device, the driving circuit used for this device becomes complicated, due to the asymmetry of the threshold voltages of the P-type LTPS TFT and the N-type LTPS TFT.

In order to eliminate the threshold voltage asymmetry between the P-type LTPS TFT and the N-type LTPS TFT in a CMOS device, an existing technology provides a method for ion-doping channels of the N-type LTPS TFTs or the P-type LTPS TFTs (channel doping), in which an ion-implantation process is performed on the channels of the LTPS TFTs to change the energy band structure of the channels and therefore the threshold voltages.

SUMMARY

An embodiment of the disclosed technology provides a thin film transistor device comprising a source electrode, a drain electrode, a gate electrode, an active layer corresponding to the gate electrode, and a gate insulation layer formed between the gate electrode and the active layer, wherein a concave region corresponding to the gate electrode is provided in the gate insulation layer.

Another embodiment of the disclosed technology provides a method for manufacturing a thin film transistor device, comprising steps of forming a thin film transistor, wherein a concave region corresponding to a gate electrode of the thin film transistor is formed in a gate insulation layer of the thin film transistor after formation of the gate insulation layer of the thin film transistor.

Still another embodiment of the disclosed technology provides an active matrix display device comprising the thin film transistor device as described above.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

With regard to the existing ion doping process performed on channels, the inventor has noted at least the following disadvantages: Firstly, since the ion-implantation process tends to damage the lattice structure in a channel region, the carrier mobility of the LTPS TFT is decreased; Secondly, a mask which covers regions other than channel region to be doped is generally formed of photoresist before the ion-implantation process, and the ion-implantation process generally hardens the surface of the photoresist on the undoped region, as a result, it is difficult to lift off the photoresist in subsequent handling.

An embodiment of the disclosed technology provides a thin film transistor device comprising a source electrode, a drain electrode, a gate electrode, an active layer corresponding to the gate electrode, and a gate insulation layer formed between the gate electrode and the active layer. A concave region corresponding to the gate electrode is formed in the gate insulation layer in the embodiment of the disclosed technology, which adjusts the threshold voltage of the thin film transistor.

An embodiment of the disclosed technology further provides a method for manufacturing a thin film transistor device, comprising steps of forming a thin film transistor, wherein a concave region corresponding to the gate electrode of the thin film transistor is formed in the gate insulation layer of the thin film transistor after the formation of the gate insulation layer of the thin film transistor.

Due to the concave region corresponding to the gate electrode formed in the gate insulation layer, the thickness of gate insulation layer between the gate electrode and the thin film transistor channel region is decreased. Therefore, voltage applied between the gate electrode and the active layer will be decreased when a charge passage in the channel region is established. In this way, the absolute value of the threshold voltage of the thin film transistor can be reduced to adjust the threshold voltage of the thin film transistor.

Hereinafter, embodiments of the disclosed technology will be described in detail with reference to the accompanying drawings so that the objects, technical solutions and advantages of the embodiments will become more apparent. It should be noted that the embodiments described below are merely a portion of but not all of the embodiments of the disclosed technology, and thus various modifications, combinations or alterations can be made on the basis of the described embodiments without departing from the spirit and scope of the disclosed technology.

First Embodiment

Figure 1A:
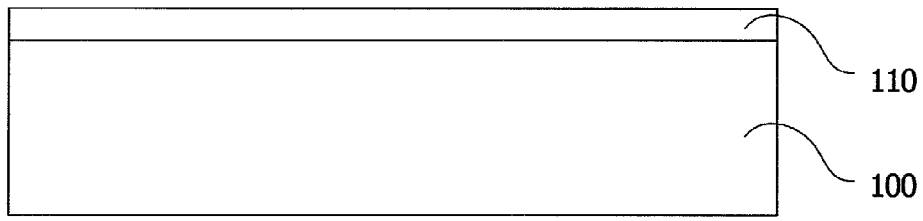
FIG. 1A to FIG. 1K are cross sectional flow charts showing a method for manufacturing a thin film transistor device according to a first embodiment of the disclosed technology.
Figure 1B:
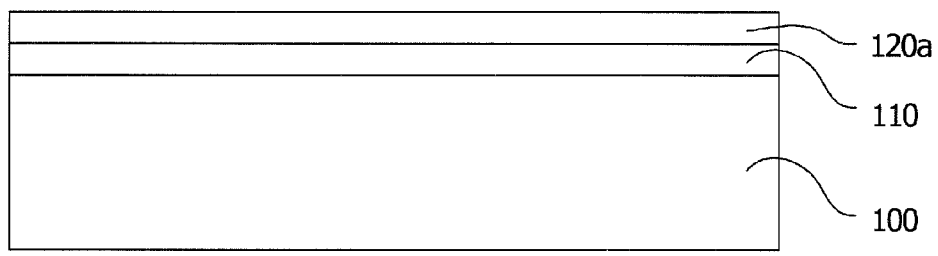
Figure 1C:
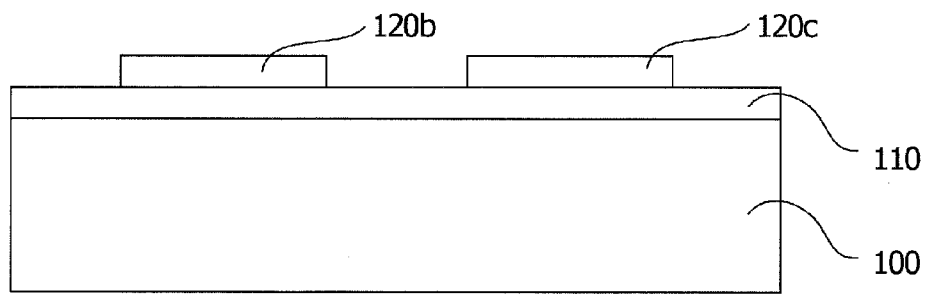
Figure 1D:
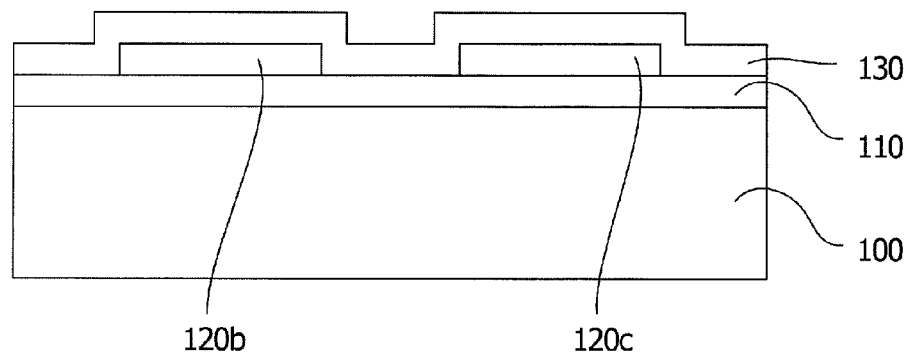
Figure 1E:
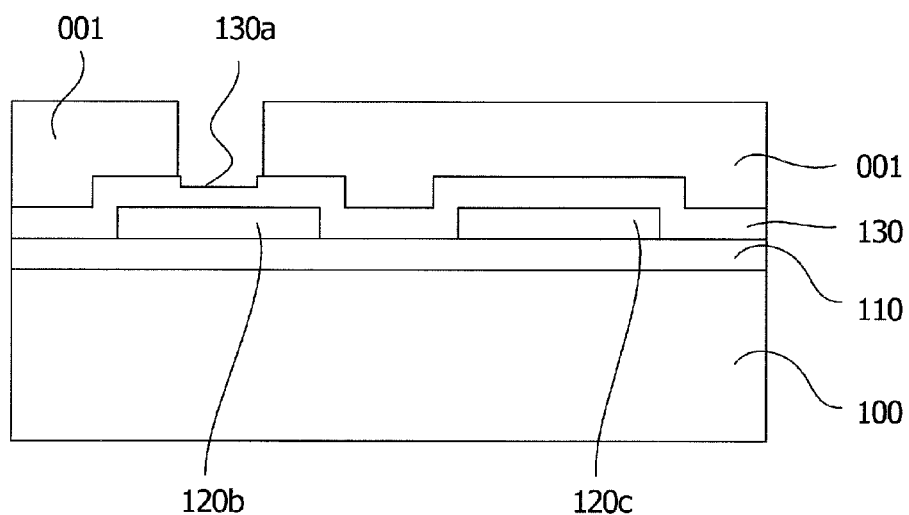
Figure 1F:
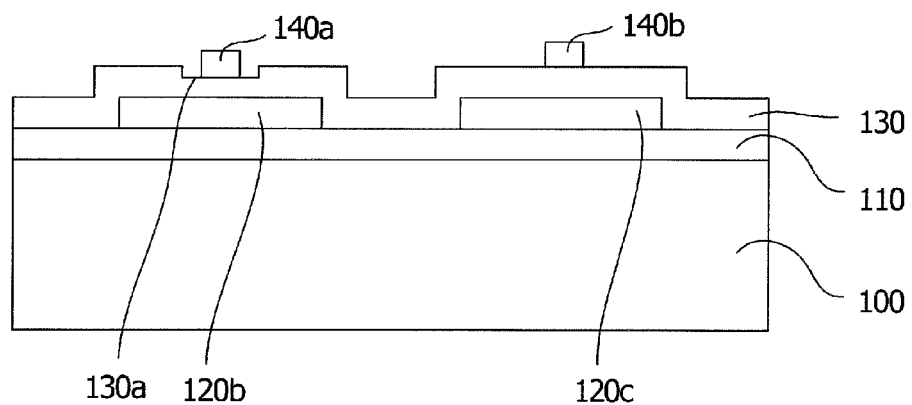
Figure 1G:
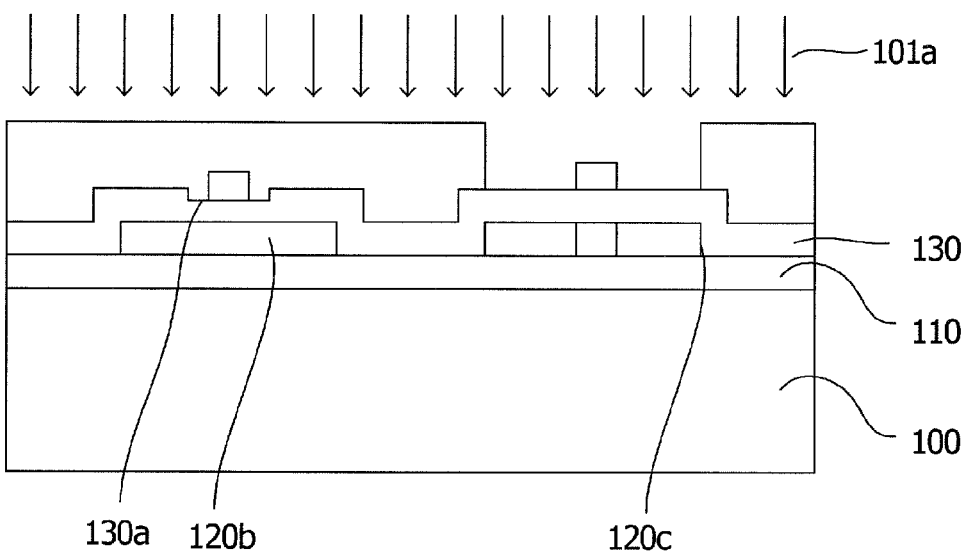
Figure 1H:
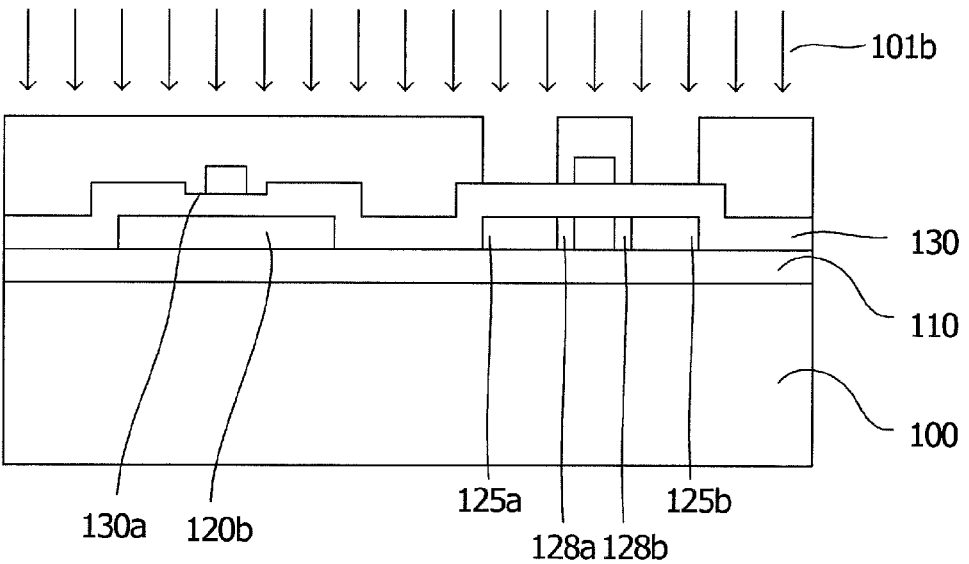
Figure 1I:
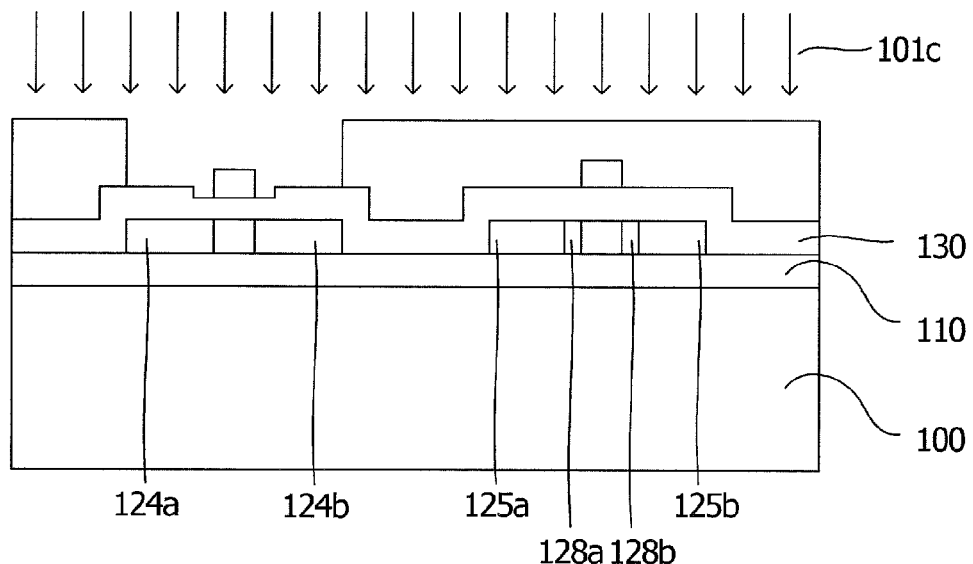
Figure 1J:
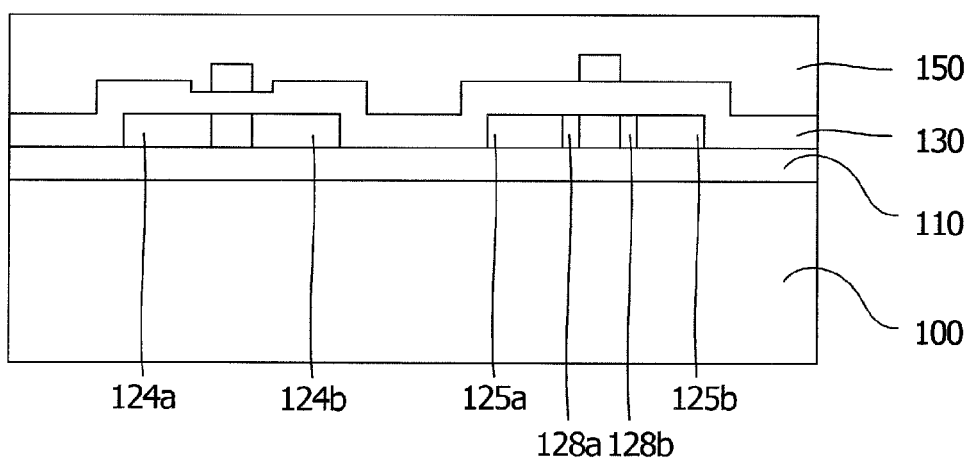
Figure 1K:
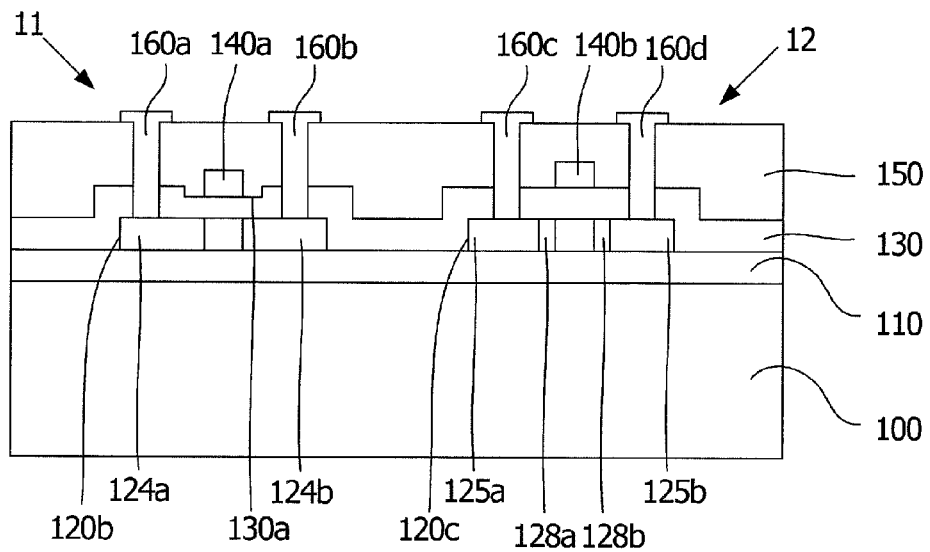

FIG. 1K shows a thin film transistor of a CMOS device, which is mainly used in the periphery driving circuit of an active matrix display device. The thin film transistor device comprises a P-type TFT 11 and an N-type TFT 12. The P-type TFT 11 comprises a source electrode 160a, a drain electrode 160b, a gate electrode 140a, an active layer 120b corresponding to the gate electrode 140a, and a gate insulation layer 130 formed between the gate electrode 140a and the active layer 120b, wherein a concave region 130a corresponding to the gate electrode 140a is formed in the surface of the gate insulation layer 130.

The thin film transistor device further comprises an N-type TFT 12 which includes a source electrode 160c, a drain electrode 160d, a gate electrode 140b, an active layer 120c corresponding to the gate electrode 140b, and a gate insulation layer 130 formed between the gate electrode 140b and the active layer 120c.

The concave region 130a corresponding to the gate electrode 140a is formed in the gate insulation layer 130 of the P-type TFT 11, that is, the concave region 130a is formed over the channel region between the source and drain electrodes 160a and 160b, and the gate electrode 140a is provided within the concave region 130a. In this case, the thickness of the gate insulation layer 130 between the gate electrode 140a and the channel region is decreased, so that voltage applied between the gate electrode 140a and substrate 100 is reduced when a charge passage in the channel region is to be established. Therefore, the absolute value of the threshold voltage of the P-type TFT 11 is decreased. The adjustment of the threshold voltage of the thin film transistor device can be independent of the ion doping concentration of the channel region in the embodiment. In other words, an ion-implantation process performed on the channel region is not needed to adjust the threshold voltage during the manufacturing process of the thin film transistor device according to the embodiment. Therefore, the decrease in carrier mobility and the difficulty in removing photoresist will be avoided.

In the embodiment, the absolute value of the threshold voltage of the CMOS device can be decreased by making the gate insulation layer 130 over the channel region of the P-type TFT 11 thinner. When the absolute value of the threshold voltage of the P-type TFT 11 is adjusted to be the same as that of the N-type TFT 12, the structure of the driving circuit which is used for controlling the CMOS device can be simplified.

The structure of the CMOS device in which the threshold voltage of the P-type TFT is adjusted is shown in the embodiment. It should be understood that a concave region corresponding to the channel region of the N-type TFT can also provided in the gate insulation layer of the N-type TFT in the device, or concave regions corresponding to respective channel regions may be provided in the gate insulation layers of both the P-type TFT and the N-type TFT respectively so as to decrease the threshold voltages of the TFTs as required.

It should also be understood that the thin film transistor device according to the embodiment of the disclosed technology is not restricted to the CMOS device described above; the thin film transistor device may also be a device which only comprises one thin film transistor or a device which comprises a plurality of thin film transistors of the same conductive type. When any of the thin film transistors described above needs a lowered threshold voltage, a concave region can be provided over the channel region in the gate insulation layer to make the gate insulation layer thinner.

The embodiment further provides a method for manufacturing the thin film transistor devices described above. Hereinafter, the method is described in detail, in reference to FIG. 1A to FIG. 1K.

Step 1, as shown in FIG. 1A, depositing a buffer layer 110 with a thickness of 50 nm on a substrate 100 by a plasma enhanced chemical vapor deposition (PECVD) method, the buffer layer 110 for example may be of a single layer or a multilayer structure, and the materials of the buffer layer 110 for example may be $SiO_X$, $SiN_X$, or other insulating materials, The substrate 100 for example may be glass, quartz, semiconductor or plastic.

Step 2, as shown in FIG. 1B, depositing a silicon layer 120a with a thickness of 50 nm on the substrate 100 with the buffer layer 110 formed thereon by a PECVD method, wherein the material of the silicon layer for example is amorphous silicon or polycrystalline silicon. In the case of a polycrystalline silicon layer, an amorphous silicon layer is firstly deposited on the substrate 100 by a PECVD method, and then the amorphous silicon layer is transformed into a polycrystalline silicon layer via a crystallization process. The crystallization process may be of a laser crystallization such as excimer laser crystallization or a solid phase crystallization (SPC).

It should be noted that the method for depositing the buffer layer 110 and the silicon layer 120a is not restricted to the PECVD method.

Step 3, as shown in FIG. 1C, patterning the silicon layer to form a patterned active layer 120b and a patterned active layer 120c, wherein the patterned active layer 120b serves as the active region for the P-type TFT and the patterned active layer 120c serves as the active region for the N-type TFT.

Step 4, as shown in FIG. 1D, depositing a gate insulation layer 130 on the substrate 100 with the patterned active layers formed thereon by a PECVD method. The layer may be a $SiO_X$ layer, a $SiN_X$ layer, or a lamination of a $SiO_X$ layer and a $SiN_X$ layer, and the deposition method is not limited to the PECVD method.

Step 5, as shown in FIG. 1E, etching to remove a part of the gate insulation layer 130 corresponding to the active region 120b of the P-type TFT by a traditional photolithography and etching process to form a concave region 130a in the top of the gate insulation layer 130. The thickness "d" to be etched can be predetermined with two following equations, $$\Delta V_{th} = qN_i/C_{ax} \text{ and } C_{ax} = \in_0 \in_r/d,$$

where $\Delta V_{th}$ is the adjusting amount of the threshold voltage which is pre-determined with a shifting performance curve of the P-type TFT; q is the amount of electric charges in the channel region, $N_i$ is the donor concentration in the channel region, $\in_0$ is the vacuum dielectric constant, and $\in_r$ is the relative dielectric constant.

According to the above two equations, there is a relationship between the adjusting amount of the threshold voltage $\Delta V_{th}$ and the thickness d to be etched, i.e., $\Delta V_{th} = dqN_i/\in_0\in_r$, which indicates that the adjusting amount of the threshold voltage $\Delta V_{th}$ is directly proportional to the thickness d to be etched.

Photoresist 001 used in the photolithography in this step may be a positive photoresist or a negative photoresist, and the layer of photoresist 001 is exposed and then developed to form the etching mask for the cave portion in the gate insulation layer; the etching process may be a wet etching process or a dry etching process.

Step 6, as shown in FIG. 1F, removing the photoresist 001 left at Step 5 and depositing a gate metal electrode layer on the gate insulation layer 130 with the concave region 130a formed thereon and then patterning the gate metal electrode layer, for example, by a traditional photolithography process to form a gate pattern. The gate pattern comprises a gate electrode 140a within the concave region 130a, i.e., the gate electrode of the P-type TFT, and the gate electrode 140b of the N-type TFT above the active layer 120c of the N-type TFT with the gate insulation layer 130 interposed therebetween. The gate metal may be Al and Al alloy, Al/Mo double layer or a multilayer structure, or other metal and alloy such as Cr, Cu, or MoW. In another example, the gate electrode may extend beyond the concave region, that is, the gate electrode covers the corresponding concave region.

Step 7, as shown in FIG. 1G, performing a drain light doping process on the active layer 120c of the N-type TFT with an ion beam 101a containing boron (B) by an ion-implantation process.

Step 8, as shown in FIG. 1H, performing a N+ doping process on the active layer 120c of the N-type TFT with an ion beam 101b containing boron (B) by an ion-implantation process so as to form a source region 125a and a drain region 125b in the N-type TFT and a first LDD doped region 128a and a second LDD doped region 128b.

Step 9, as shown in FIG. 1I, performing a P+ doping process on the active layer 120b of the P-type TFT with an ion beam 101c containing phosphorus (P) by an ion-implantation process so as to faun a source region 124a and a drain region 124b in the P-type TFT.

Step 10, putting the substrate with the structures thus formed into an annealing furnace for re-bonding the Si—Si bonds in the doped region so as to improve the conductivity of the doped region, and then an interlayer insulating layer 150, such as a single layer of $SiO_X$ or $SiN_X$ or a lamination of a $SiO_X$ layer and a $SiN_X$ layer, is deposited, as shown in FIG. 1J.

Step 11, forming via holes within the interlayer insulating layer 150 by using a photolithography process to expose the source region 124a and the drain region 124b of the P-type TFT 11 and the source region 125a and the drain region 125b of the N-type TFT 12, as shown in FIG. 1K, and then depositing a source-drain metal layer on the interlayer insulating layer 150 with the via holes formed therein and patterning the source-drain metal layer to form a source/drain electrode pattern comprising a source electrode 160a and a drain electrode 160b of the P-type TFT 11 and a source electrode 160c and a drain electrode 160d of the N-type TFT 12, wherein the source-drain metal, for example, is Al and Al alloy, Al/Mo double-layer or a multilayer, or any other metal or alloy such as Cr, Cu, or MoW.

Since the concave region is formed in the gate insulation layer by etching a part of the gate insulation layer over the active layer of the P-type TFT in Step 5, the gate insulation layer 220 between the gate electrode 210 and the channel region becomes thinner. In this case, voltage applied between the gate electrode 210 and the source electrode 240a or voltage applied between the gate electrode 210 and the drain electrode 240b can be decreased when a charge passage in the channel region is to be established. Therefore, the absolute value of the threshold voltage of the P-type TFT 11 is decreased. Since the adjustment of the threshold voltage of the thin film transistor device can be independent of the ion doping concentration of the channel region in the embodiment (i.e., the thin film transistor device according to the embodiment is manufactured without performing an ion-implantation process on the channel region), the decrease in carrier mobility and the difficulty in removing photoresist can be avoided. At the same time, the driving voltage and thus the power consumption can be decreased by adjusting the threshold voltage of the thin film transistor device.

It should be noted that although the concave region is only formed in the gate insulating layer of the P-type TFT to lower its threshold voltage in the manufacturing method described above, a concave region corresponding to the gate electrode of the N-type TFT can also be provided in the gate insulation layer of the N-type TFT in order to decrease its threshold voltage.

It should be further noted that the thin film transistor device to be manufactured may also include only one thin film transistor or a plurality of thin film transistors of the same conduction type. In this case, if any of the thin film transistors in these devices needs a lower threshold voltage, a concave region corresponding to its gate electrode can be provided in its gate insulation layer during the manufacturing process.

Second Embodiment

Figure 2A:
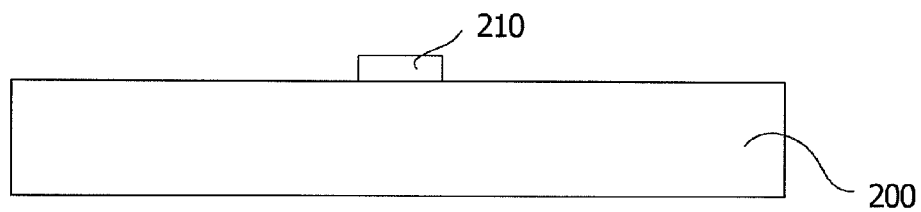
FIG. 2A to FIG. 2F are cross sectional flow charts showing a method for manufacturing a thin film transistor device according to a second embodiment of the disclosed technology.
Figure 2B:
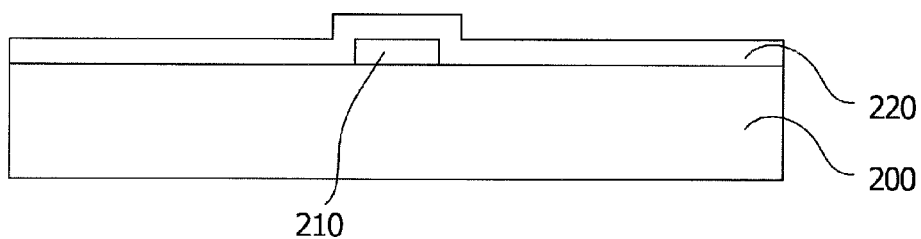
Figure 2C:
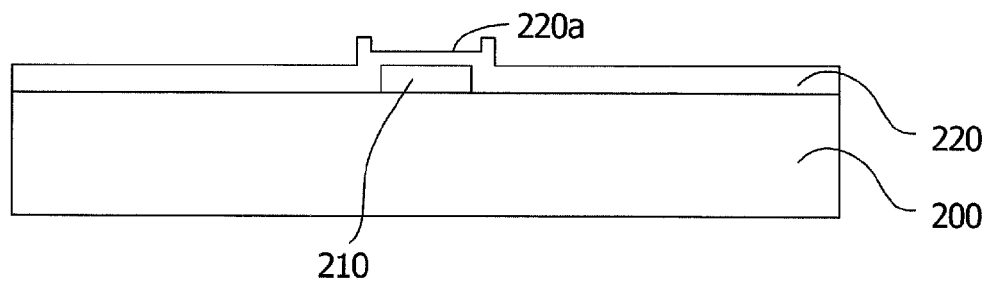
Figure 2D:
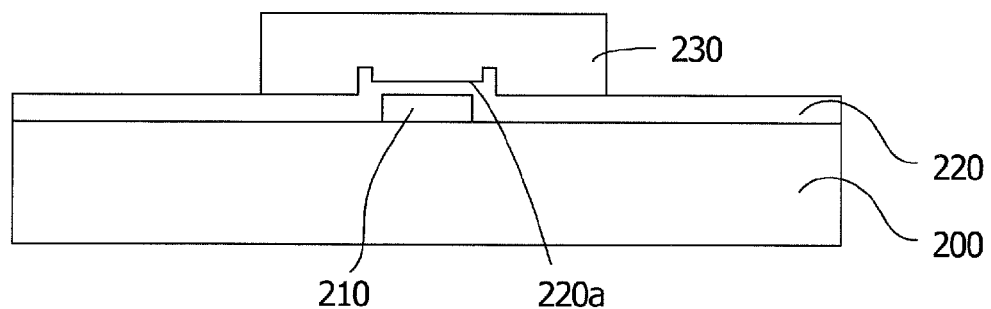
Figure 2E:
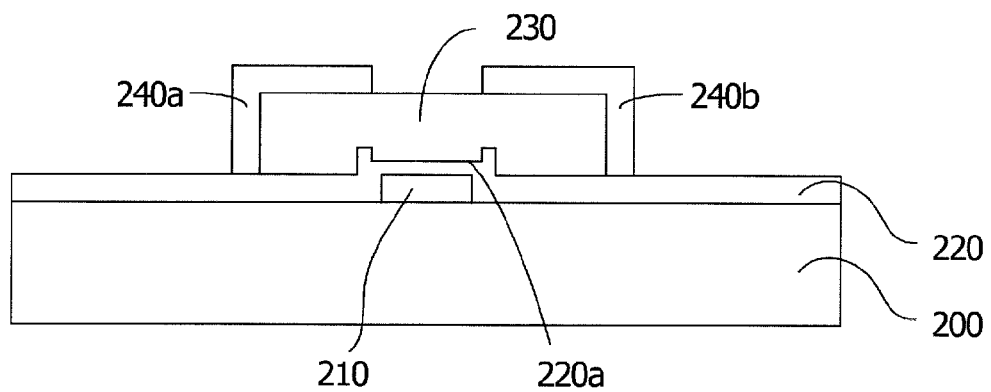
Figure 2F:
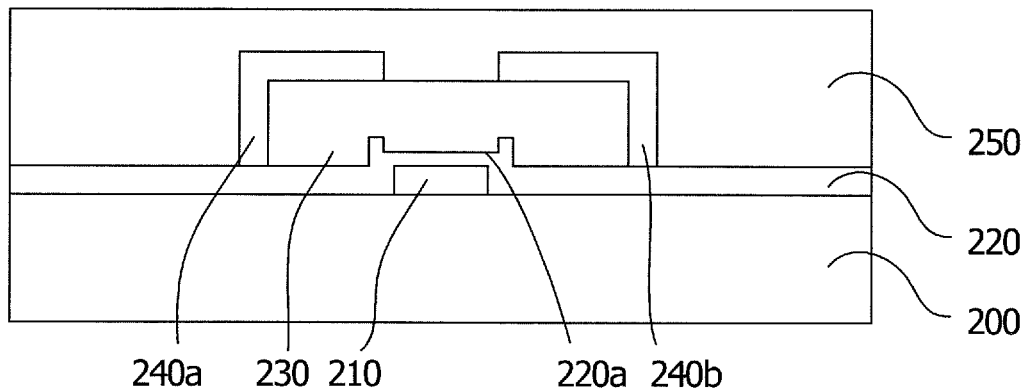

FIG. 2F shows a semiconductor device comprising a P-type or N-type TFT, which may be used for providing driving current or driving voltage for a pixel unit in a pixel driving circuit of an active matrix display device. The P-type or N-type TFT comprises a source electrode 240a, a drain electrode 240b, a gate electrode 210, an active layer 230 corresponding to the gate electrode 210, and a gate insulation layer 220 formed between the gate electrode 210 and the active layer 230, wherein the gate insulation layer 220 is formed over the gate electrode, and a concave region 220a corresponding to the gate electrode 210 is provided in the gate insulation layer 220.

In the TFT device according to the embodiment, since the concave region 220a corresponding to the gate electrode 210 is formed in the gate insulation layer 220, the gate insulation layer 220 between the gate electrode 210 and the channel region becomes thinner. In this case, voltage applied between the gate electrode 210 and the source electrode 240a or voltage applied between the gate electrode 210 and the drain electrode 240b is decreased when a charge passage in the channel region is to be established. Therefore, the absolute value of the threshold voltage of the TFT can be decreased. Since the adjustment of the threshold voltage of the thin film transistor device is independent of the ion doping concentration of the channel region in the embodiment, that is, the thin film transistor device according to the embodiment can be manufactured without performing an ion-implantation process on the channel region, the decrease in carrier mobility and the difficulty in removing photoresist can be avoided. At the same time, the driving voltage and thus the power consumption can be decreased by adjusting the threshold voltage of the thin film transistor device.

The embodiment further provides a method for manufacturing the thin film transistor device described above. Hereinafter, the method is described in detail, in reference to FIG. 2A to FIG. 2F.

Step 1, depositing a conductive layer on a substrate 20 by a sputtering process and patterning the conductive layer by a lithography and etching process to formed a gate electrode 210, as shown in FIG. 2A, the material of the substrate for example may be glass, transparent plastic or other transparent material, and the material of the gate electrode for example may be tantalum, chromium, molybdenum, titanium or aluminum;

Step 2, forming a gate insulation layer 220 on the substrate 200 with the gate electrode 210 formed thereon by a PECVD method, and the material of the gate insulation layer for example may be silicon nitride, silicon oxynitride, silicon oxide or other dielectric material, as shown in FIG. 2B;

Step 3, forming a concave region 220a corresponding to the gate electrode 210 in the gate insulation layer 220 by a traditional photolithography and etching process, as shown in FIG. 2C, and the etched thickness may be predetermined by the method descried in the first embodiment.

Step 4, forming an active layer pattern comprising an active layer 230 covering the concave region 220a in the gate insulation layer 220 with the concave region 220a formed thereon, as shown in FIG. 2D, and the active layer 230 comprising a source region and a drain region for example may be an amorphous silicon layer, an oxide semiconductor layer, or a polycrystalline silicon layer.

Step 5, forming a source/drain electrode pattern comprising a source electrode 240a and a drain electrode 240b on the substrate 200 with the active layer pattern formed thereon, the source electrode 240a is in contact with the source region of the active layer 230, and the drain electrode 240b is in contact with the drain region of the active layer 230, as shown in FIG. 2E.

Step 6, forming a protective layer 250 on the substrate with the source electrode 240a and the drain electrode 240b formed thereon as shown in FIG. 2F, so as to perform a passivation process on the back channel region to prevent an increase of leakage current.

In the method for manufacturing the thin film transistor device according to the embodiment, the concave region formed in the gate insulation layer by etching a part of the gate insulation layer above the gate electrode of the TFT at Step 3 makes the gate insulation layer in the channel region thinner. In this case, voltage applied between the gate electrode and the source electrode or voltage applied between the gate electrode and the drain electrode is decreased when a charge passage in the channel region is to be established. Therefore, the absolute value of the threshold voltage of the TFT can be decreased. Since the adjustment of the threshold voltage of the thin film transistor device does not involve an ion-implantation process on the channel region in the embodiment, the decrease in carrier mobility and the difficulty in removing photoresist can be avoided. At the same time, when the thin film transistor is used in a pixel driving circuit of an active matrix display device, the driving voltage of the thin film transistor and thus the power consumption of the whole pixel driving circuit are reduced due to the lower threshold voltage of the thin film transistor.

It should be noted that although the concave region 220a in the gate insulation layer 220 is covered by the active layer 230 in the embodiment, the concave region can also expand beyond the coverage range of the active layer 230, that is, the active layer 230 may formed as a whole within the concave region. In this case, the thickness of the gate insulation layer under the channel region is also decreased and the threshold voltage of the thin film transistor device is reduced.

Third Embodiment

Figure 3:
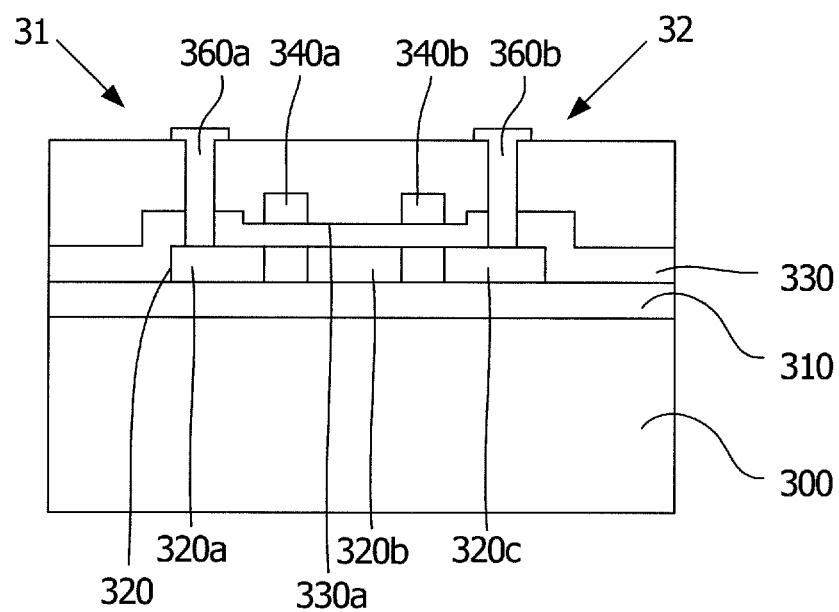
FIG. 3 is a cross section view of the thin film transistor device according to a third embodiment of the disclosed technology.

FIG. 3 shows a TFT device comprising two adjacent thin film transistors formed on a substrate 300 with a buffer layer 310 formed thereon. The two thin film transistors are of the same conductive type and are electrically connected in series. The thin film transistor 31 comprises a gate electrode 340a, a drain region 320a, a source region 320b, and a drain electrode 360a. The thin film transistor 32 comprises a gate electrode 340b, a source region 320c and a source electrode 360b. The source region 320b of the thin film transistor 31 is also used as the drain region of the thin film transistor 32 so as to form a series connection structure. Therefore, the drain electrode 360a of the thin film transistor 31 is used as the drain electrode of the TFT device, and the source electrode 360b of the thin film transistor 32 is used as the source electrode of the TFT device.

The source regions and the drain regions of the two TFTs are formed within the same active layer 320; a gate insulation layer 330 is formed between the gate electrodes 340a and 340b of the two TFTs 31 and 32 and active layer 320; a concave region 330a is formed in the gate insulation layer 330; and both the gate electrode 340a of the thin film transistor 31 and the gate electrode 340b of the thin film transistor 32 are formed within the concave region 330a.

In the thin film transistor device according to the embodiment, the gate electrodes of the two adjacent thin film transistors connected in series are provided within the concave region formed in the gate insulation layer, so that the thickness of the gate insulation layer corresponding to the channel region in the two TFTs are both decreased. In this case, voltage applied between the gate electrodes of the two TFTs and the substrate are decreased at the same time when a charge passages in the channel regions is needed. Therefore, the absolute values of the threshold voltages of the two TFTs are both decreased. Since the adjustment of the threshold voltage of the thin film transistor device is independent of the ion doping concentration in the channel region in the embodiment, that is, the thin film transistor device according to the embodiment can be manufactured without performing an ion-implantation process on the channel region, the decrease in carrier mobility and the difficulty in removing photoresist can be avoided.

It should be noted that there may be two or more than two thin film transistors whose gate electrodes are provided within a concave region or concave regions in a thin film transistor device. Such thin film transistors are not necessarily electrically connected. If such thin film transistors are electrically connected, they may be connected in series, in parallel, or both in series and in parallel.

The thin film transistor devices according to the embodiments of the disclosed technology may be used for fabricating an active backplane of an active matrix display device, such as an active matrix liquid crystal display (AM-LCD) or an active matrix organic light-emitting display (AM-OLED).

The disclosed technology being thus described, it will be obvious that the same may be varied in many ways. Such variations are not to be regarded as a departure from the spirit and scope of the disclosed technology, and all such modifications as would be obvious to those skilled in the art are intended to be comprised within the scope of the following claims.

What is claimed is:

1. A thin film transistor device comprising at least two adjacent thin film transistors, each of the at least two adjacent thin film transistors comprising a source electrode, a drain electrode, a gate electrode, an active layer corresponding to the gate electrode, and a gate insulation layer formed between the gate electrodes and the active layer, wherein a concave region is provided in the gate insulation layer, and wherein the gate electrodes of the at least two adjacent thin film transistors correspond to one concave region.

2. The thin film transistor device according to claim 1, wherein the gate insulation layer is above the gate electrode, and the active layer is within the concave region or covers the concave region.

3. The thin film transistor device according to claim 2, wherein the active layer is of P-conductive type or N-conductive type.

4. The thin film transistor device according to claim 2, wherein a thickness of a removed part of the gate insulation layer in the concave region is directly proportional to an adjusting amount of a threshold voltage of the thin film transistor device.

5. The thin film transistor device according to claim 1, wherein the gate insulation layer is above the active layer, and the gate electrode is provided at least partially within the concave region.

6. The thin film transistor device according to claim 5, wherein the active layer is of P-conductive type or N-conductive type.

7. The thin film transistor device according to claim 5, wherein a thickness of a removed part of the gate insulation layer in the concave region is directly proportional to an adjusting amount of a threshold voltage of the thin film transistor device.

8. The thin film transistor device according to claim 1, wherein the active layer is of P-conductive type or N-conductive type.

9. The thin film transistor device according to claim 1, wherein a thickness of a removed part of the gate insulation layer in the concave region is directly proportional to an adjusting amount of a threshold voltage of the thin film transistor device.

10. An active matrix display device comprising the thin film transistor device as claimed in claim 1.

11. The active matrix display device of claim 10, wherein the active matrix display device is a liquid crystal display device or an organic light-emitting display device.

12. The thin film transistor device according to claim 1, wherein a thickness of the gate insulating layer in the concave region is less than a thickness of other portions of the gate insulating layer.

* * * * *